(12) United States Patent
Garbossa et al.

(10) Patent No.: US 11,181,560 B2
(45) Date of Patent: Nov. 23, 2021

(54) DETECTING FAILURE USING MULTIPLE MONITORING MODULES

(71) Applicant: Infineon Technologies AG, Neubiberg (DE)

(72) Inventors: Cristian Garbossa, Bressanone (IT); Marco Piselli, Padua (IT)

(73) Assignee: Infineon Technologies AG, Neubiberg (DE)

( * ) Notice: Subject to any disclaimer, the term of this patent is extended or adjusted under 35 U.S.C. 154(b) by 246 days.

(21) Appl. No.: 16/413,430

(22) Filed: May 15, 2019

(65) Prior Publication Data

US 2020/0363457 A1 Nov. 19, 2020

(51) Int. Cl.
*G01R 19/165* (2006.01)
*G01R 31/28* (2006.01)

(52) U.S. Cl.
CPC ... *G01R 19/16528* (2013.01); *G01R 31/2836* (2013.01)

(58) Field of Classification Search
CPC ............ G01R 19/16528; G01R 19/165; G01R 19/16566; G01R 31/00; G01R 31/2836; G01R 31/2832
See application file for complete search history.

(56) References Cited

U.S. PATENT DOCUMENTS

2018/0172758 A1* 6/2018 Kashima ................. H01L 23/58
2020/0333386 A1* 10/2020 Bennett ..................... G06F 1/28

OTHER PUBLICATIONS

"ISO 26262," Wikipedia, the Free Encyclopedia, last edited on May 12, 2019 accessed on May 14, 2019, 7 pp.

* cited by examiner

*Primary Examiner* — Manuel L Barbee
(74) *Attorney, Agent, or Firm* — Shumaker & Sieffert, P.A.

(57) ABSTRACT

A circuit for detecting failure of a device includes a plurality of monitoring modules. Each respective monitoring module of the plurality of monitoring modules is configured to generate a monitoring value at an output of the respective monitoring module based on a signal received at an input of the respective monitoring module. The circuit further includes a data selector module configured to couple, for each step of a switching cycle, the input of each of the plurality of monitoring modules to one of a plurality of function modules such that each of the plurality of monitoring modules generates the monitoring value for each of the plurality of function modules to generate monitoring information and evaluation logic configured to determine whether a failure has occurred at the plurality of function modules based on the monitoring information.

20 Claims, 11 Drawing Sheets

DETECTING FAILURE USING MULTIPLE MONITORING MODULES

TECHNICAL FIELD

This disclosure relates to techniques for detecting a failure in hardware components.

BACKGROUND

Monitoring systems can be used to detect a failure in a hardware component of a device. For example, a monitoring device may detect when a voltage output by a voltage regulator exceeds a safety voltage threshold. In response to the voltage exceeding the safety voltage threshold, the monitoring device may be configured to disable the voltage supply to help to prevent failures in the device and to help to ensure safety to users of the device.

SUMMARY

In general, this disclosure is directed to techniques for ensuring safety in the operation of function modules (e.g., voltage regulators, voltage dividers, etc.) of a device. For example, a circuit may include a data selector module that permits multiple monitoring modules to be used determine whether a failure has occurred at a particular function module. For instance, a demultiplexer of the data selector module may switch multiple comparators to a single voltage regulator, where each comparator compares an output of the single voltage regulator with a safety voltage. In this way, a failure of the function module (e.g., voltage supply) of the device may be detected even when a particular monitoring module (e.g., a comparator) is unable to detect the failure.

In an example, a circuit for detecting failure of a device includes: a plurality of monitoring modules, wherein each respective monitoring module of the plurality of monitoring modules is configured to generate a monitoring value at an output of the respective monitoring module based on a signal received at an input of the respective monitoring module; a data selector module configured to couple, for each step of a switching cycle, the input of each of the plurality of monitoring modules to one of a plurality of function modules such that each of the plurality of monitoring modules generates the monitoring value for each of the plurality of function modules to generate monitoring information; and evaluation logic configured to determine whether a failure has occurred at the plurality of function modules based on the monitoring information.

In another example, a method for detecting failure of a device includes: coupling, for each step of a switching cycle, an input of each of a plurality of monitoring modules to one of a plurality of function modules such that each of the plurality of monitoring modules generates a monitoring value for each of the plurality of function modules to generate monitoring information; and determining whether a failure has occurred at the plurality of function modules based on the monitoring information.

In another example, a system for detecting a failure of a device includes: a plurality of function modules; a plurality of monitoring modules, wherein each respective monitoring module of the plurality of monitoring modules is configured to generate a monitoring value at an output of the respective monitoring module based on a signal received at an input of the respective monitoring module; a data selector module configured to couple, for each step of a switching cycle, the input of each of the plurality of monitoring modules to one of the plurality of function modules such that each of the plurality of monitoring modules generates the monitoring value for each of the plurality of function modules to generate monitoring information; and evaluation logic configured to determine whether a failure has occurred at the plurality of function modules based on the monitoring information.

Details of these and other examples are set forth in the accompanying drawings and the description below. Other features, objects, and advantages will be apparent from the description and drawings, and from the claims.

DETAILED DESCRIPTION

This disclosure is directed to techniques for detecting failure of a device. The techniques for detecting failure of a device as described herein may address hardware and/or timing optimization in safety systems, as the ones addressed in the ISO 26262. In some examples, techniques for detecting failure of a device as described herein may be applied to in automotive applications to account for systems that require a certain Automotive Safety Integrity Level (ASIL) level. For instance, techniques for detecting failure of a device as described herein may account for failures of the system, with particular attention to the target Technical Safety requirements (TSR). A direct violation of the TSR may be considered as a Single Point Failure (SPF) of the system and the system may be configured to apply special measures (e.g., Safety Mechanisms, SM) for such faults in order to be able to detect them and react in a way to bring the system into a fail-safe state. In addition, for SPF, techniques for detecting failure of a device as described herein may also add a runtime integrity test to check the proper functionality of the SM in place.

Some safety mechanisms perform a Built-In Self-Test (BIST) at least once per driving cycle as per the ISO 26262. However, the time needed to do the BIST may force the system to be OFF and not available, which is undesirable. In some safety mechanisms, redundant circuits may be placed in the system to avoid the SPF issue, but such safety mechanisms require additional hardware, thereby resulting in additional area (e.g., die or board) and/or power consumption.

In accordance with techniques described herein, a system may be configured to couple, for each step of a switching cycle, an input of each monitoring module to one of a multiple function modules such that each of the monitoring modules generates the monitoring value for each of the function modules. In this way, a multiplexing and demultiplexing process in the monitoring interfaces may transform single monitoring blocks into an array of redundant modules. In some examples, systems configured to couple, for each step of a switching cycle, the input of each monitoring modules to one of a multiple function modules may implement measures to avoid a latent fault using already available blocks, instead of requiring dedicated blocks for the safety mechanisms integrity check test.

Figure 1:
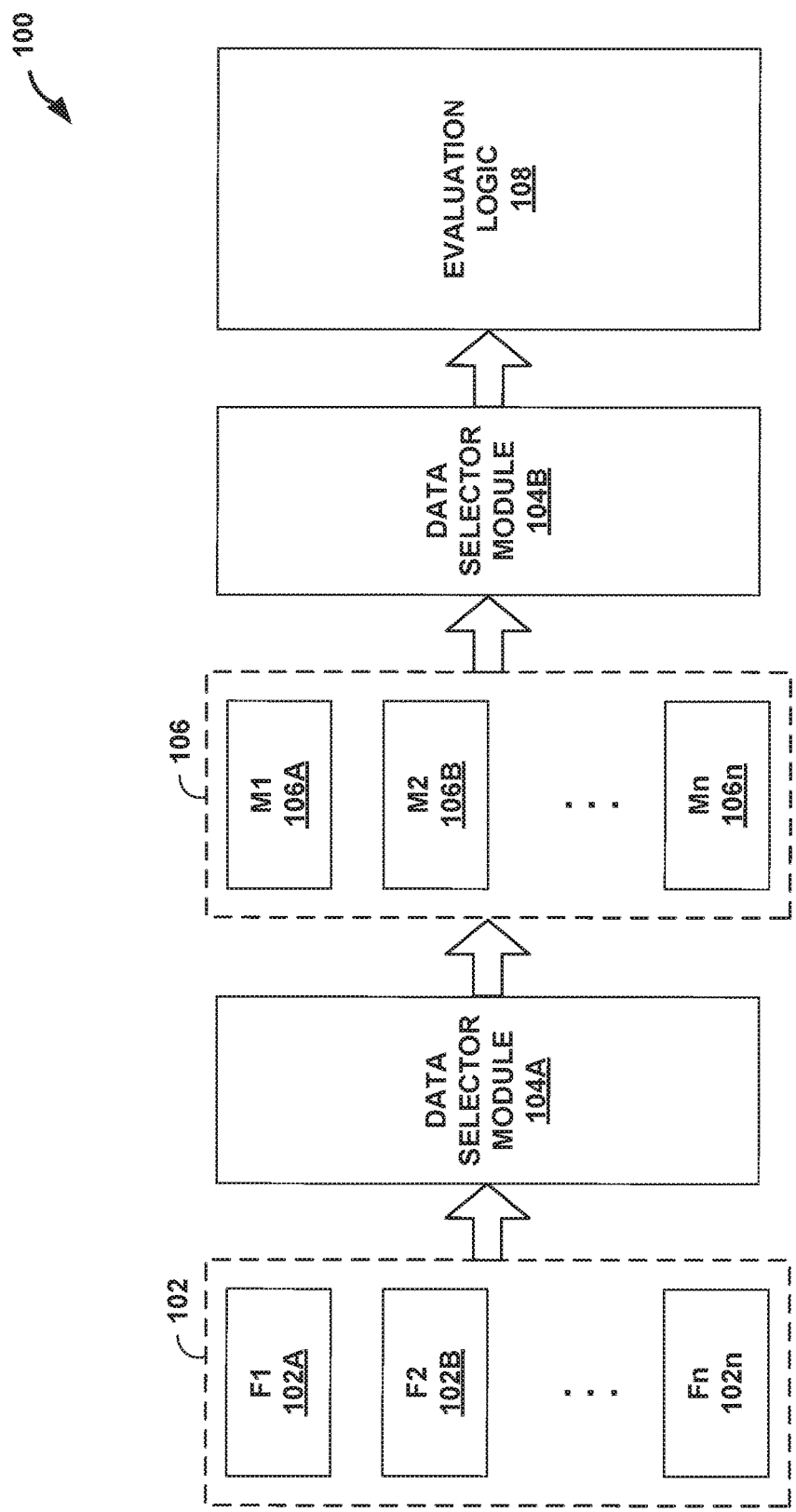
FIG. 1 is a block diagram illustrating an example system for detecting failure of a device, in accordance with one or more techniques of this disclosure.

FIG. 1 is a block diagram illustrating an example system for detecting failure of a device, in accordance with one or more techniques of this disclosure. As illustrated in the example of FIG. 1, system 100 may include function modules 102A, 102B through 102n (collectively, function modules 102), data selector modules 104A, 104B (collectively data selector module 104, monitoring modules 106A, 106B through 106n (collectively, monitoring modules 106), and evaluation logic 108. In the foregoing, 'n' may refer to any positive integer (e.g., 3, 4, or more than 4). Although the example of FIG. 1 illustrates three or more function modules, in some examples, two function modules may be used.

Each one of function modules 102 may be configured to generate a signal. For example, each one of function modules 102 may include a voltage regulator configured to generate a regulated voltage, current, or power. For instance, function module 102A may be configured to supply a first voltage, function module 102B may be configured to supply a second voltage, and so on. The voltages supplies by function modules 102 may be the same or may be different.

Monitoring modules 106 may be configured to generate a monitoring value at an output of the respective monitoring module based on a signal received at an input of the respective monitoring module. For example, each one of monitoring modules 106 may include a comparator configured to generate the monitoring value based on a voltage threshold. For instance, monitoring module 106A may be configured to compare a voltage of a signal receive at the input of monitoring module 106A to a threshold voltage (e.g., a safety voltage) and output an indication that a failure has occurred when the voltage of a signal receive at the input monitoring module 106A exceeds the voltage threshold. Similarly, monitoring module 106B may be configured to compare a voltage of a signal receive at the input of monitoring module 106B to a threshold voltage (e.g., a safety voltage) and output an indication that a failure has occurred when the voltage of a signal receive at the input monitoring module 106B exceeds the voltage threshold. The voltage thresholds for comparators of monitoring modules 106 may be the same or they may be different.

Data selector module 104 may be configured to couple, for each step of a switching cycle, an input of each of monitoring modules 106 to one of function modules 102 such that each of monitoring modules 106 generates the monitoring value for each of function modules 102 to generate monitoring information. For example, data selector module 104A may include a demultiplexer configured to couple function module 102A to any one of monitoring modules 106, a demultiplexer configured to couple function module 102B to any one of monitoring modules 106, and so on. In some examples, data selector module 104B may include a multiplexer configured to couple monitoring module 106A to any one of multiple inputs of evaluation logic 108, a multiplexer configured to couple monitoring module 106B to any one of multiple inputs of evaluation logic 108, and so on.

Evaluation logic 108 may be configured to determine whether failure has occurred at function modules 102 based on monitoring information. For example, evaluation logic 108 may be configured to determine a failure has occurred at function module 102A in response to monitoring modules 106 outputting an indication that a failure has occurred to an input of evaluation logic assigned to function module 102A. Similarly, evaluation logic 108 may be configured determine a failure has occurred at function module 102B in response to monitoring modules 106 outputting an indication that a failure has occurred to an input of evaluation logic assigned to function module 102B. In some examples, evaluation logic 108 may determine a failure has occurred at function module 102A in response to a majority of monitoring modules 106 outputting an indication that a failure has occurred.

In some examples, system 100 may include processing circuitry. For example, one or more of function modules 102, data selector module 104, one or more of monitoring modules 106, evaluation logic 108, or another component may include processing circuitry. In some examples, processing circuitry includes only analog components. Processing circuitry may be a microcontroller on a single integrated circuit containing a processor core, memory, inputs, and outputs. For example, the processing circuitry may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, the processing circuitry may be a combination of one or more analog components and one or more digital components.

Figure 2:
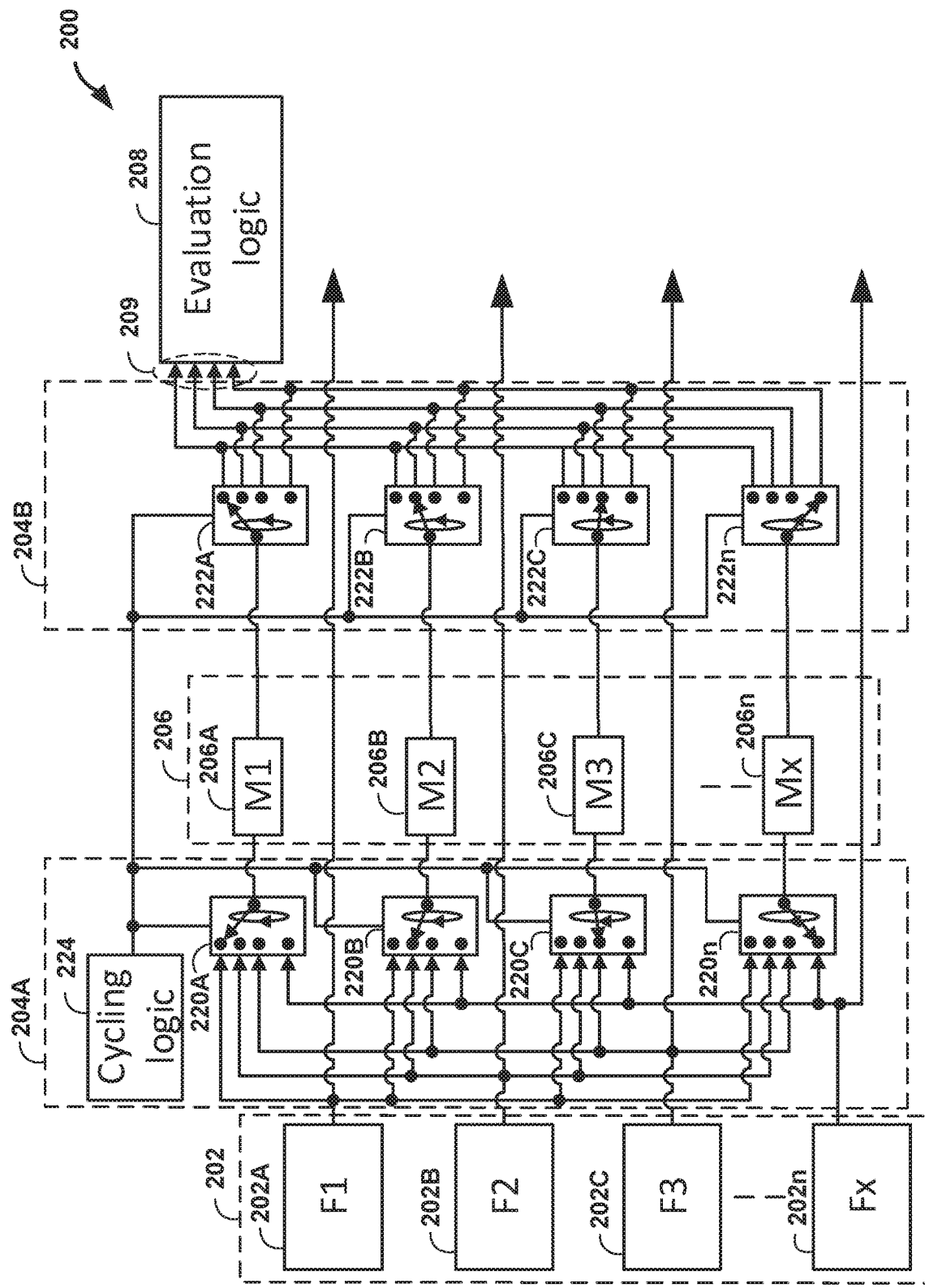
FIG. 2 is a conceptual diagram illustrating a first example circuit for detecting failure of a device, in accordance with one or more techniques of this disclosure.

FIG. 2 is a conceptual diagram illustrating a first example circuit 200 for detecting failure of a device, in accordance with one or more techniques of this disclosure. Circuit 200 may include function modules 202A, 202B, 202C through 202n (collectively, "function modules 202"), data selector modules 204A, 204B (collectively data selector module 204), monitoring modules 206A, 206B, 206C through 206n (collectively, monitoring modules 206), and evaluation logic 208, which may be examples of function modules 102, data selector module 104, monitoring modules 106, and evaluation logic 108, respectively, of FIG. 1. Data selector module 204 includes cycling logic 224, demultiplexers 220A, 220B, 220C through 220n (collectively, demultiplexers 220), and multiplexers 222A, 222B, 222C through 222n (collectively, multiplexers 222). Cycling logic 224 may be based on a counter. Evaluation logic 208 may be configured to count consecutive failures at function modules 202. In the foregoing, 'n' may refer to any positive integer (e.g., 4, 5, or more than 5). Although the example of FIG. 2 illustrates four or more function modules, in some examples, two or three function modules may be used.

Generally, demultiplexers 220 may be configured to select a single channel for the monitoring array of monitoring modules 260 and multiplexers 222 may be configured to re-adjust the monitoring information at the end of the chain. For example, demultiplexer 220A may be configured to couple, for each step of a switching cycle, an input of each of the monitoring modules 206 to one of the function modules 202. Multiplexer 222A may be configured to select one evaluation input from evaluation inputs 209 of evaluation logic 208 and couple the output of monitoring module 206A to the selected evaluation input. In the example of FIG. 2, each evaluation input of evaluation inputs 209 is assigned to a respective function module of function modules 202.

In the example of FIG. 2, circuit 200 does not require a built-in self-test module. Instead, monitoring modules 206 may be tested, in real time, by using demultiplexers 220 and multiplexers 222 to transform single monitoring modules of monitoring modules 206 into an array of redundant monitoring modules.

Figure 3:
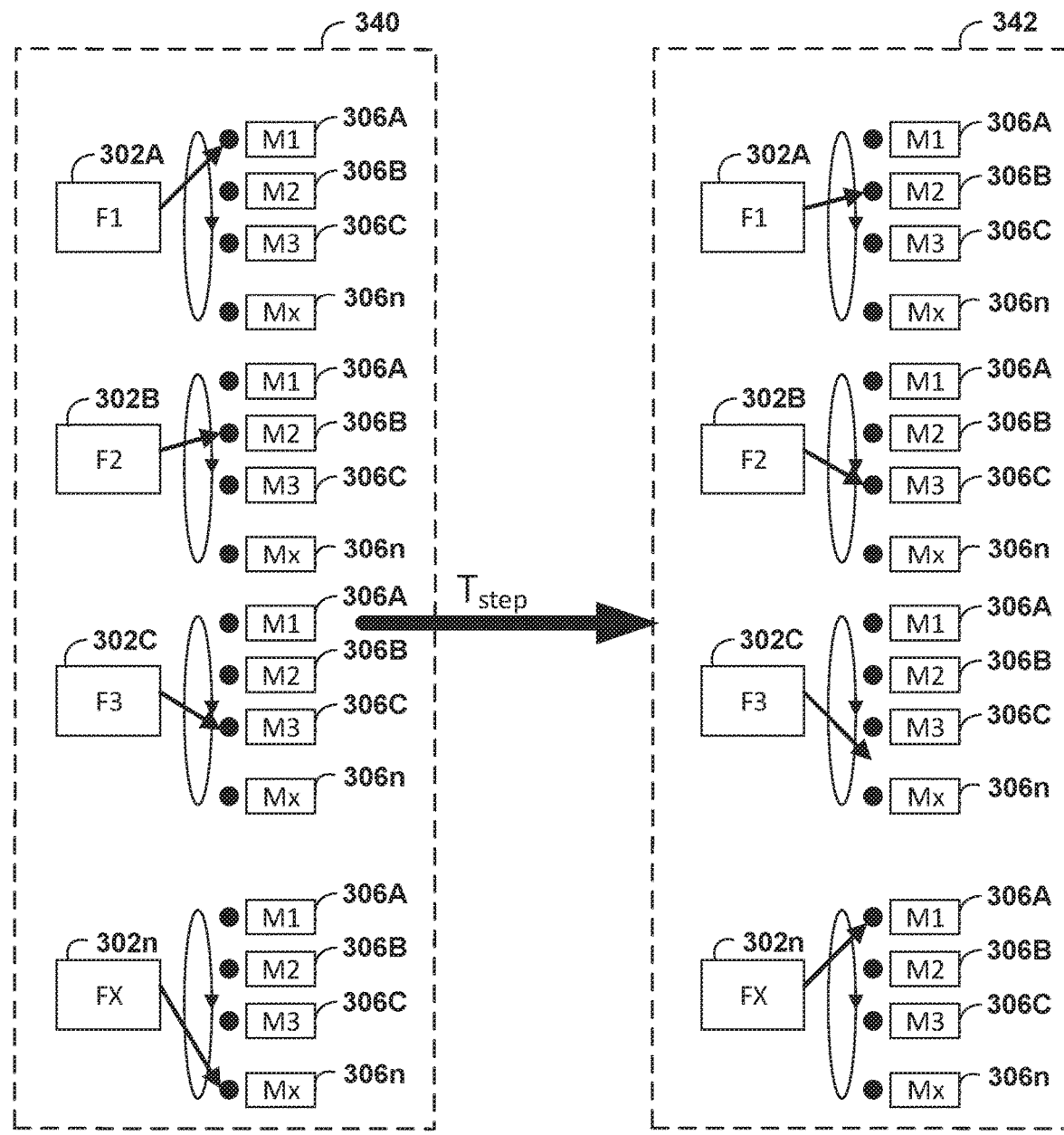
FIG. 3 is a conceptual diagram illustrating first example switching for detecting failure of a device, in accordance with one or more techniques of this disclosure.

FIG. 3 is a conceptual diagram illustrating first example switching for detecting failure of a device, in accordance with one or more techniques of this disclosure. The example of FIG. 3 includes function modules 302A, 302B, 302C through 302n (collectively, function modules 302) and monitoring modules 306A, 306B, 306C through 306n (collectively, monitoring modules 306), which may be examples of function modules 102 and monitoring modules 106, respectively, of FIG. 1. FIG. 3 is discussed with reference to FIGS. 1 and 2 for example purposes only. In the example of FIG. 3, 'n' may refer to any positive integer. For example, function module 302n may be a fourth function module, fifth function module, etc. Similarly, monitoring module 306n may be a fourth function module, a fifth function module, etc. Although the example of FIG. 3 illustrates four or more function modules, other examples may include two or three function modules.

In the example of FIG. 3, cycling logic (e.g., cycling logic 224) is configured to cause, for each step of the switching cycle, the data selector module to select, for each of function modules 302, one monitoring module from monitoring modules 306 and couple, for each of the function modules 302, a respective function module through the selected monitoring module to a respective evaluation input of the evaluation logic that is assigned to the respective function module. For example, a data selector module (e.g., data selector module 104 or data selector module 204) couples, for each step of a switching cycle, the input of each one of monitoring modules 306 to one of function modules 302 such that each of monitoring modules 306 generates a monitoring value for each of function modules 302 to generate monitoring information.

For example, during a first step 340 of a switching cycle, the data selector module couples: (1) the input of monitoring module 306A to function module 302A, (2) the input of monitoring module 306B to function module 302B, (3) the input of monitoring module 306C to function module 302C, and so on until the data selector module couples the input of monitoring module 306n to function module 302n. During a second step 342 of the switching cycle, the data selector module couples: (1) the input of monitoring module 306B to function module 302A, (2) the input of monitoring module 306C to function module 302B, (3) the input of monitoring module 306C to a fourth function module (not shown), and so on until the data selector module couples the input of monitoring module 306n to function module 302A.

Techniques described herein may use hardware already available in a system. For example, some systems may already include function modules 302 and for each one of function modules 302, one dedicated monitoring module of monitoring modules 306. In such systems, the introduction of a data selector may permit a redundant check without additional monitoring modules. For example, multiplexers (and corresponding demultiplexers) of a data selector may permit each of function modules 302 to be monitored by the whole bundle of monitoring modules 306 to permit a redundant check of each of function modules 302. As such, if a particular monitoring module (e.g., a comparator of the monitoring module) is damaged, the single measurement from the particular monitoring module does not affect monitoring modules 306 as a whole, as each of function modules 302 is monitored by multiple (e.g., 2, 3, or more) monitoring modules 306.

Figure 4:
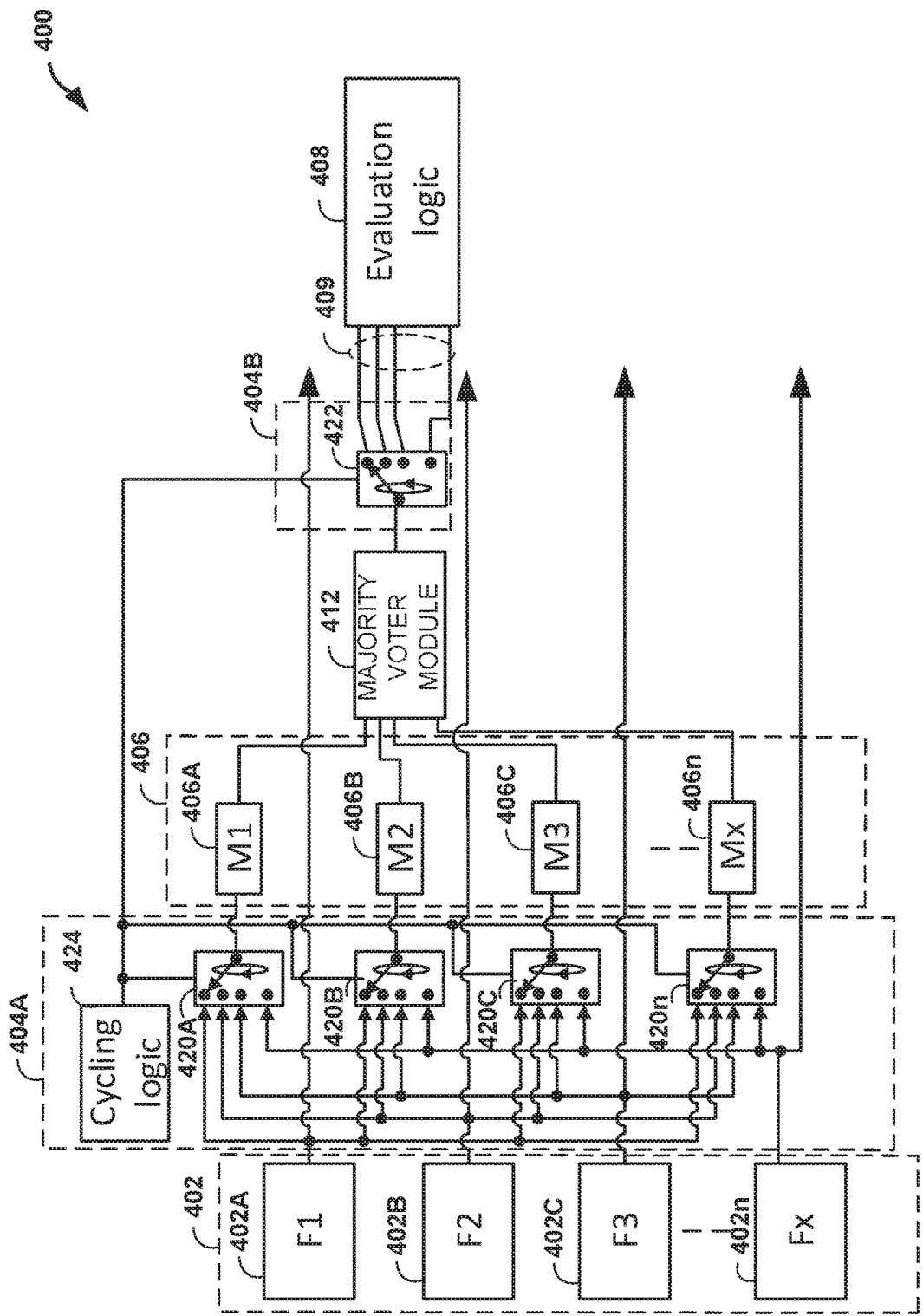
FIG. 4 is a conceptual diagram illustrating a second example circuit for detecting failure of a device, in accordance with one or more techniques of this disclosure.

FIG. 4 is a conceptual diagram illustrating a second example circuit 400 for detecting failure of a device, in accordance with one or more techniques of this disclosure. Circuit 400 may include function modules 402A, 402B, 402C through 402n (collectively, function modules 402), data selector modules 404A, 404B (collectively data selector module 404), monitoring modules 406A, 406B, 406C through 406n (collectively, monitoring modules 406), and evaluation logic 408, which may be examples of function modules 102, data selector module 104, monitoring modules 106, and evaluation logic 108, respectively, of FIG. 1. Data selector module 404 includes cycling logic 424, demultiplexers 420A, 420B, 420C through 420n (collectively, demultiplexers 420), and multiplexer 422. Cycling logic 424 may be based on a counter. Evaluation logic 408 may be configured to count consecutive failures at function modules 402. In the foregoing, 'n' may refer to any positive integer.

In the example of FIG. 4, circuit 400 further includes majority voter module 412. Majority voter module 412 may be configured to receive a monitoring value from the output of each of monitoring modules 406 and output a single monitoring value corresponding to a majority of the monitoring values received. For example, in response to receiving, from monitoring modules 406, more monitoring values that indicate a failure has occurred at function module 402A than monitoring values that indicate a failure has not occurred at function module 402A, majority voter module 412 may generate a single monitoring value indicating that a failure has occurred at function module 402A. Similarly, in response to receiving, from monitoring modules 406, fewer monitoring values that indicate a failure has occurred at function module 402A than monitoring values that indicate a failure has not occurred at function module 402A, majority voter module 412 may generate a single monitoring value indicating that a failure has not occurred at function module 402A.

Data selector module 404B includes multiplexer 422 configured to select one evaluation input from evaluation inputs 409 of evaluation logic 408 and to couple majority voter module 412 to the selected evaluation input of evaluation inputs 409. In the example of FIG. 4, majority voter module 412 may perform majority voting before the multiplexing and the redundancy may be implemented in real time. Circuit 400 does not include a built-in self-test module. Instead, monitoring modules 406 may be tested, in real time, using demultiplexers 420 and multiplexers 422 to transform single monitoring modules into an array of redundant monitoring modules.

Figure 5:
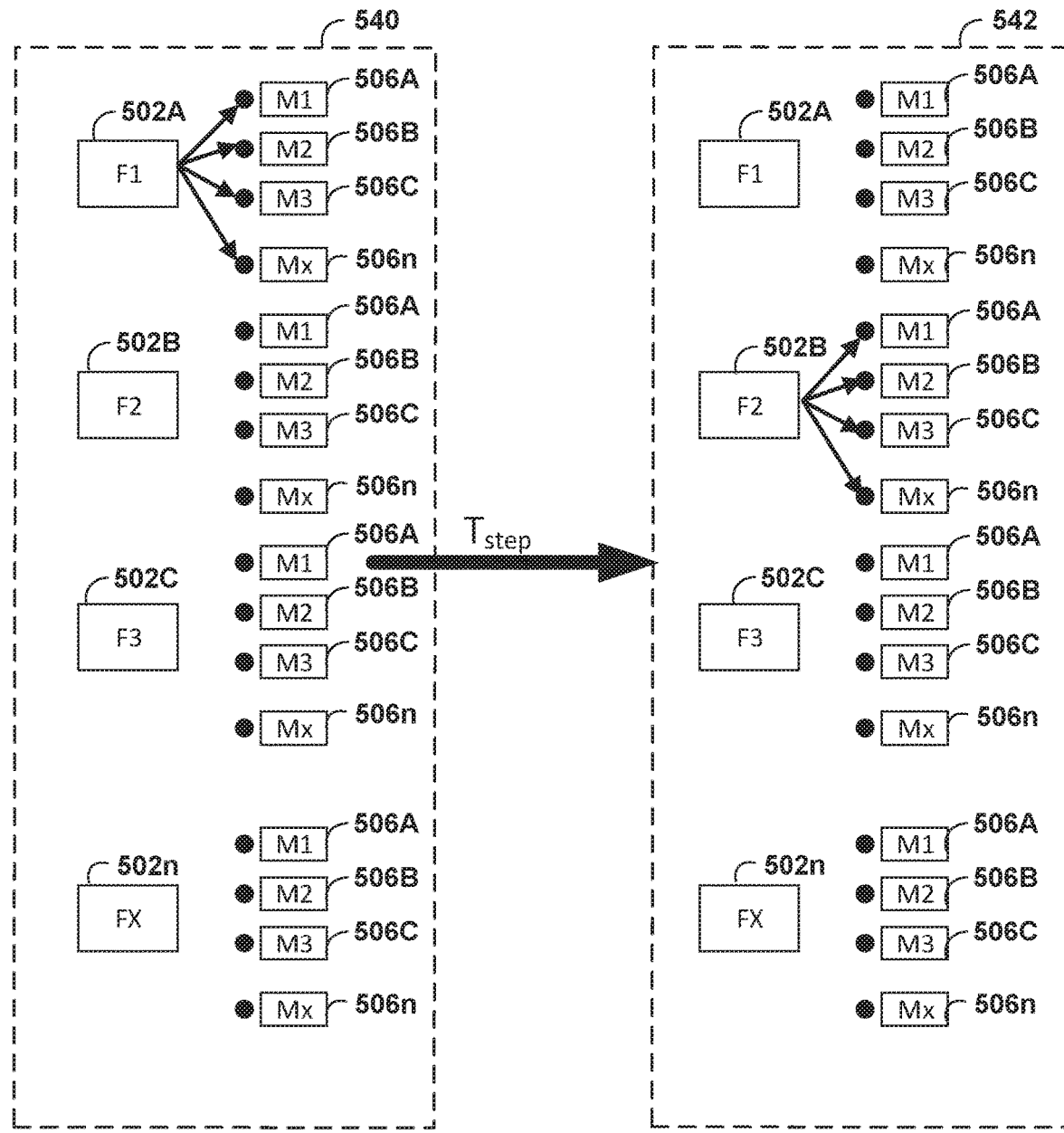
FIG. 5 is a conceptual diagram illustrating second example switching for detecting failure of a device, in accordance with one or more techniques of this disclosure.

FIG. 5 is a conceptual diagram illustrating second example switching for detecting failure of a device, in accordance with one or more techniques of this disclosure. The example of FIG. 5 includes function modules 502A, 502B, 502C through 502n (collectively, function modules 502) and monitoring modules 506A, 506B, 506C through 506n (collectively, monitoring modules 506), which may be examples of function modules 102 and monitoring modules 106, respectively, of FIG. 1. In the example of FIG. 5, cycling logic (e.g., cycling logic 424 of FIG. 4) is configured to cause, for each step of a switching cycle, a data selector module to select a function module from function modules 502 and couple the selected function module to the input of each of the monitoring modules 506. In the example of FIG. 5, 'n' may refer to any positive integer. For example, function module 502n may be a fourth function module, fifth function module, etc. Similarly, monitoring module 506n may be a fourth function module, a fifth function module, etc. Although the example of FIG. 5 illustrates four or more function modules, other examples may include two or three function modules.

For example, a data selector module (e.g., data selector module 104, data selector module 204, data selector module 404, etc.) couples, for each step of a switching cycle, the input of each of monitoring modules 506 to one of function modules 502 such that each of monitoring modules 506 generates a monitoring value for each of function modules 502 to generate monitoring information. For example, each function module of function modules 502 is measured one after the other at the same time by all of monitoring modules 506. For instance, during a first step 540 of a switching cycle, the data selector module couples: (1) the input of monitoring module 506A to function module 502A, (2) the input of monitoring module 506B to function module 502A, (3) the input of monitoring module 506C to function module 502A, and so on until the data selector module couples the input of monitoring module 506n to function module 502A. During a second step 542 of the switching cycle, the data selector module couples: (1) the input of monitoring module 506A to function module 502B, (2) the input of monitoring module 506B to function module 502B, (3) the input of monitoring module 506C to function module 502B, and so on until the data selector module couples the input of monitoring module 506n to function module 502B.

Figure 6:
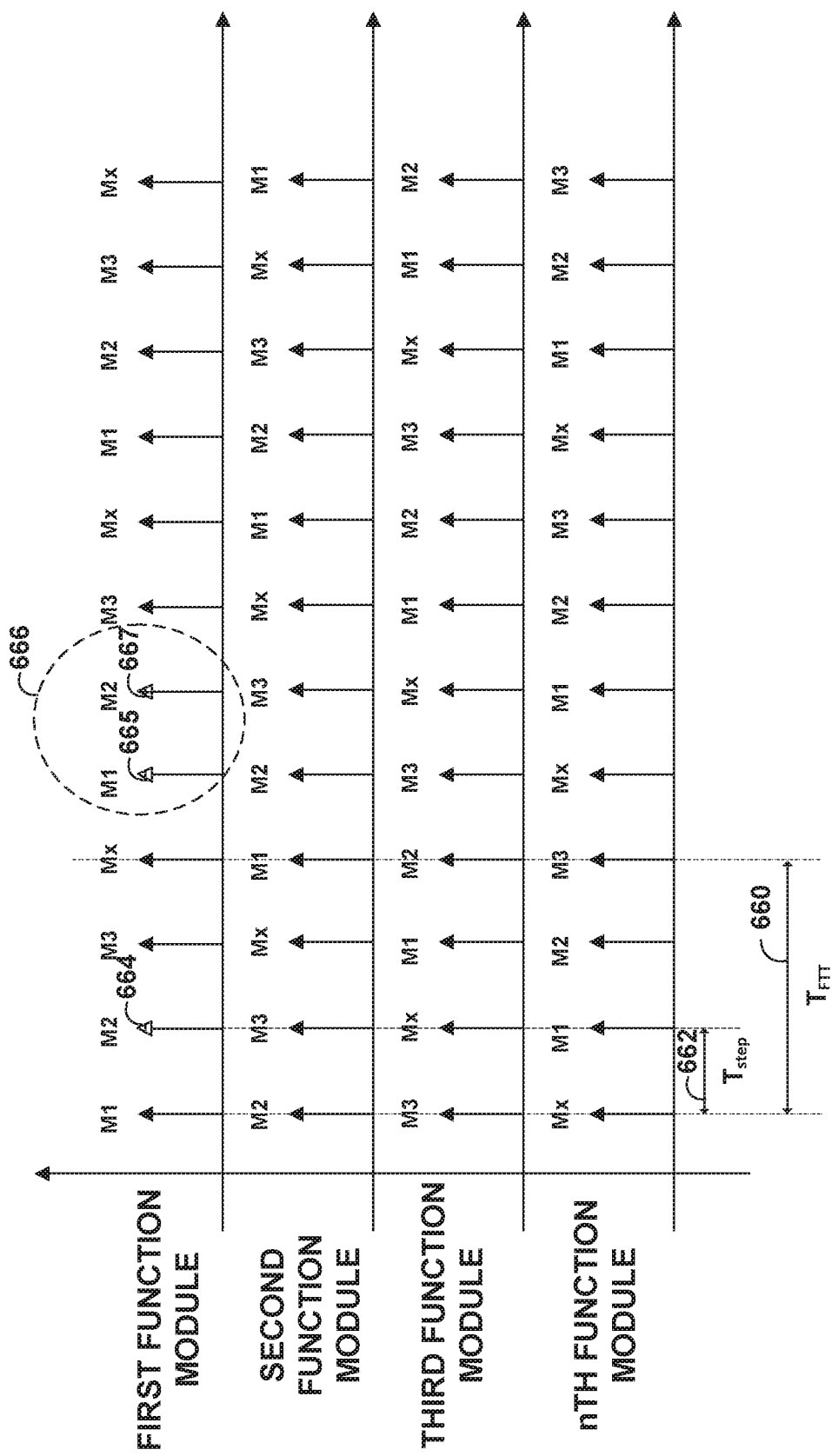
FIG. 6 is a conceptual diagram illustrating a first example of a detection of failure of a monitoring module, in accordance with one or more techniques of this disclosure.

FIG. 6 is a conceptual diagram illustrating a first example of a detection of failure of a monitoring module, in accordance with one or more techniques of this disclosure. A Time Fault Tolerant Time (TFTT) 660 may be defined from when a fault occurs until when the system is able to recognize the fault and react to reach a safe state. In case the multiplexing step time between different monitoring is faster than time step (Tstep) 662, the system can work to satisfy (e.g., not violate) safety requirements. As shown, in the example of FIG. 6, a time duration for the switching cycle (i.e., three times Tstep 662) is equal to the time fault tolerant time 660 for the device. As Tstep 662 decreases, a number of different monitoring modules that could participate to the monitoring within the TFTT increases. In some examples, a time duration for the switching cycle (i.e., three times Tstep 662) may be less than the time fault tolerant time 660 for the device. In the example of FIG. 6, more than 3 monitoring modules are used. However, in other examples, fewer (e.g., 2 or 3) or more (e.g., more than 4) may be used.

The pass fail criterion used by evaluation logic may be linked to a number of consecutive failures detected. In the example of FIG. 6, a failure at a function module (e.g., function modules 102, function modules 202, function modules 402, etc.) is defined as two consecutive fault indications from monitoring modules (e.g., monitoring modules 106, monitoring modules 206, monitoring modules 406, etc.). For example, evaluation logic (e.g., evaluation logic 108, evaluation logic 208, evaluation logic 408, etc.) may refrain from determining that a failure has occurred at a first function module when the monitoring information includes a single failure 664 but may determining that a failure has occurred at the first function module when the monitoring information includes two failures 666. In this example, a first failure 665 of two failures 666 is detected by a first monitoring module and a second failure 667 of two failures 666 is detected by a second monitoring module. In this way, a failure of one single monitoring module (e.g., a comparator for an example case of a supply system) does not result in the evaluation logic erroneously determining that a failure has occurred at a function module.

In order to also cover a negative failure (e.g., a failure that brings the monitoring module to lack an ability to detect a failure in the function module) an additional monitoring module may be used for a total of a minimum of three monitoring modules for one function module. For example, in the configuration implemented in FIG. 6, the redundant algorithm is two out of three. In still other cases, four or more monitoring modules or five or more monitoring modules could be used for one function module, so as to add even more redundancy and promote safety.

Figure 7:
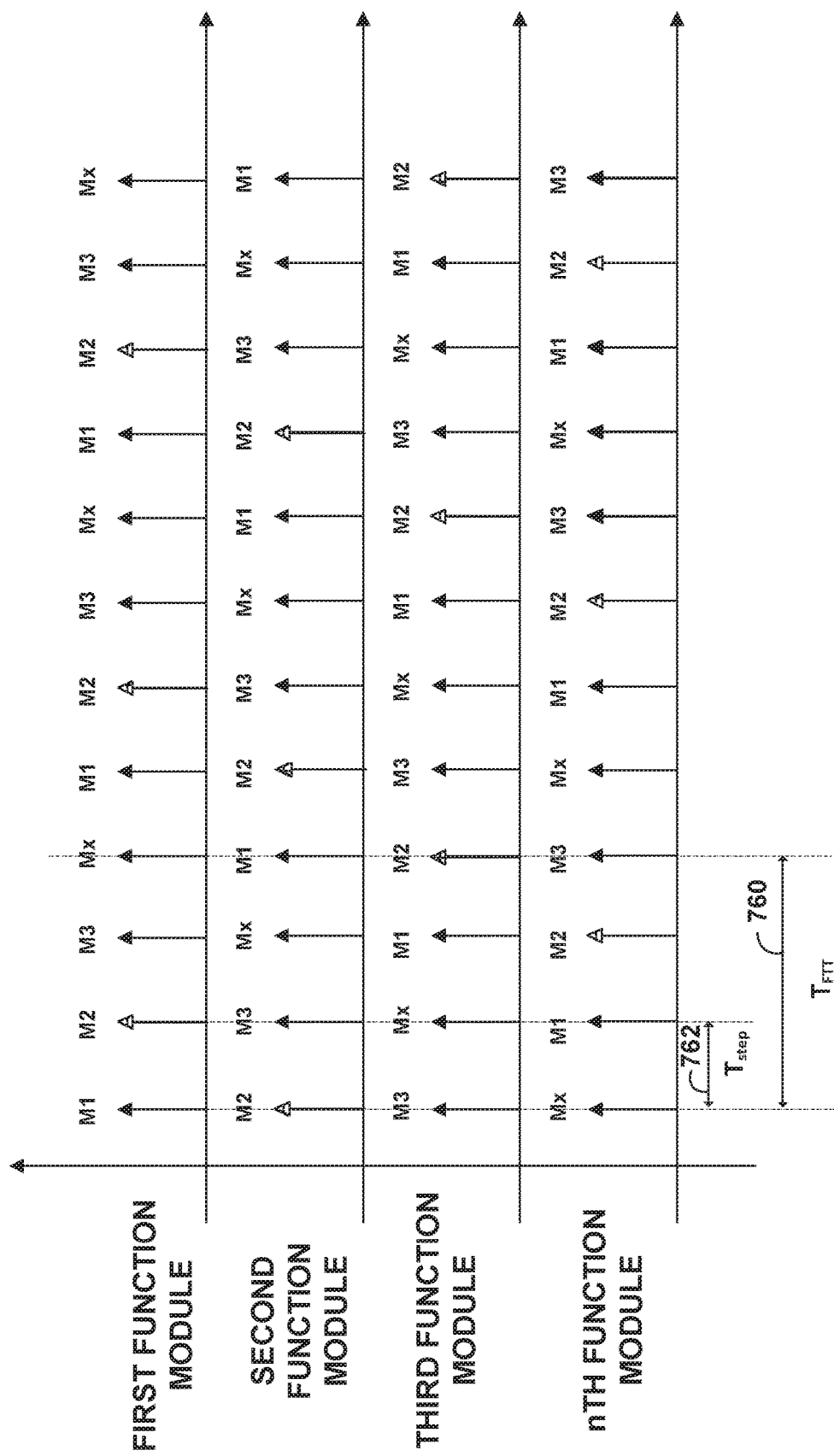
FIG. 7 is a conceptual diagram illustrating a second example of a detection of failure of a monitoring module, in accordance with one or more techniques of this disclosure.

FIG. 7 is a conceptual diagram illustrating a second example of a detection of failure of a monitoring module, in accordance with one or more techniques of this disclosure. In the example of FIG. 7, the second monitoring module, "M2" has failed such that the second monitoring module always outputs a monitoring value indicating a failure has occurred. In this example, the failure of the second monitoring module may result in evaluation logic 108 and/or a majority voter module (e.g., majority voter module 412) accounting for the failure of the second monitoring module (e.g., by being outvoted by other monitoring modules). In this way, system 100 may be have a higher availability for the user compared to systems that rely on a single monitoring module for each function module. In some examples, a time duration for the switching cycle (i.e., three times Tstep 762) may be less than the time fault tolerant time 760 for the device. In the example of FIG. 7, more than 3 monitoring modules are used. However, in other examples, fewer (e.g., 2 or 3) or more (e.g., more than 4) may be used.

Figure 8:
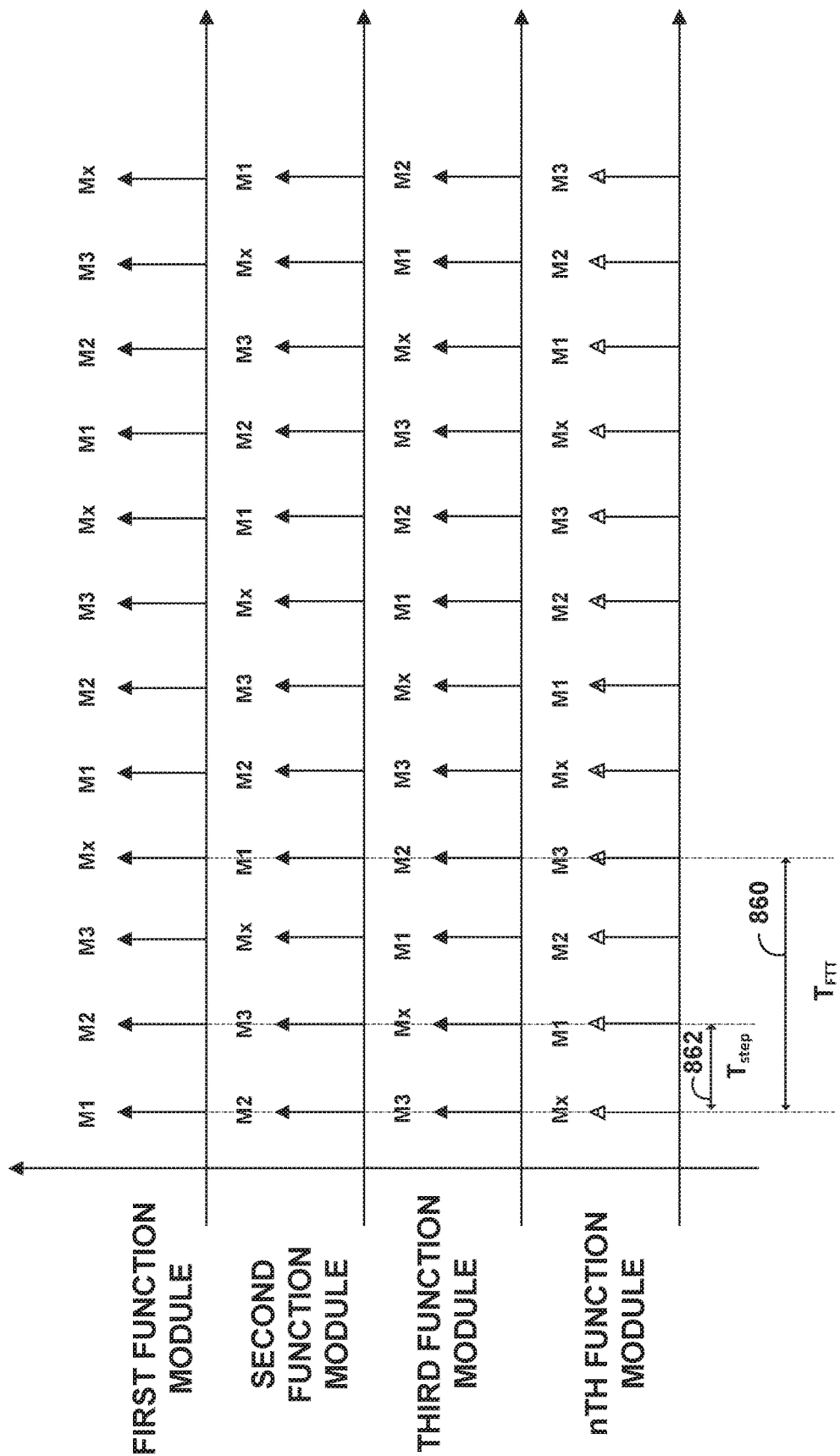
FIG. 8 is a conceptual diagram illustrating a third example of a detection of failure of a monitoring module, in accordance with one or more techniques of this disclosure.

FIG. 8 is a conceptual diagram illustrating a third example of a detection of failure of a monitoring module, in accordance with one or more techniques of this disclosure. In the example of FIG. 8, system 100 may include a dummy signal in a function module of function modules 102 to check an integrity of monitoring modules 106 during a switching cycle. For example, the 'nth' function module may be configured to check the ability to detect a failure event. For instance, the nth function module may be configured to output a testing voltage that exceeds a voltage threshold. In this example, each of the monitoring modules outputs a monitoring value indicating that a failure has occurred at the nth function module. In this way, system 100 may be configured to perform a real time self-check of the monitoring modules without relying on built-in self-test circuitry.

Figure 9:
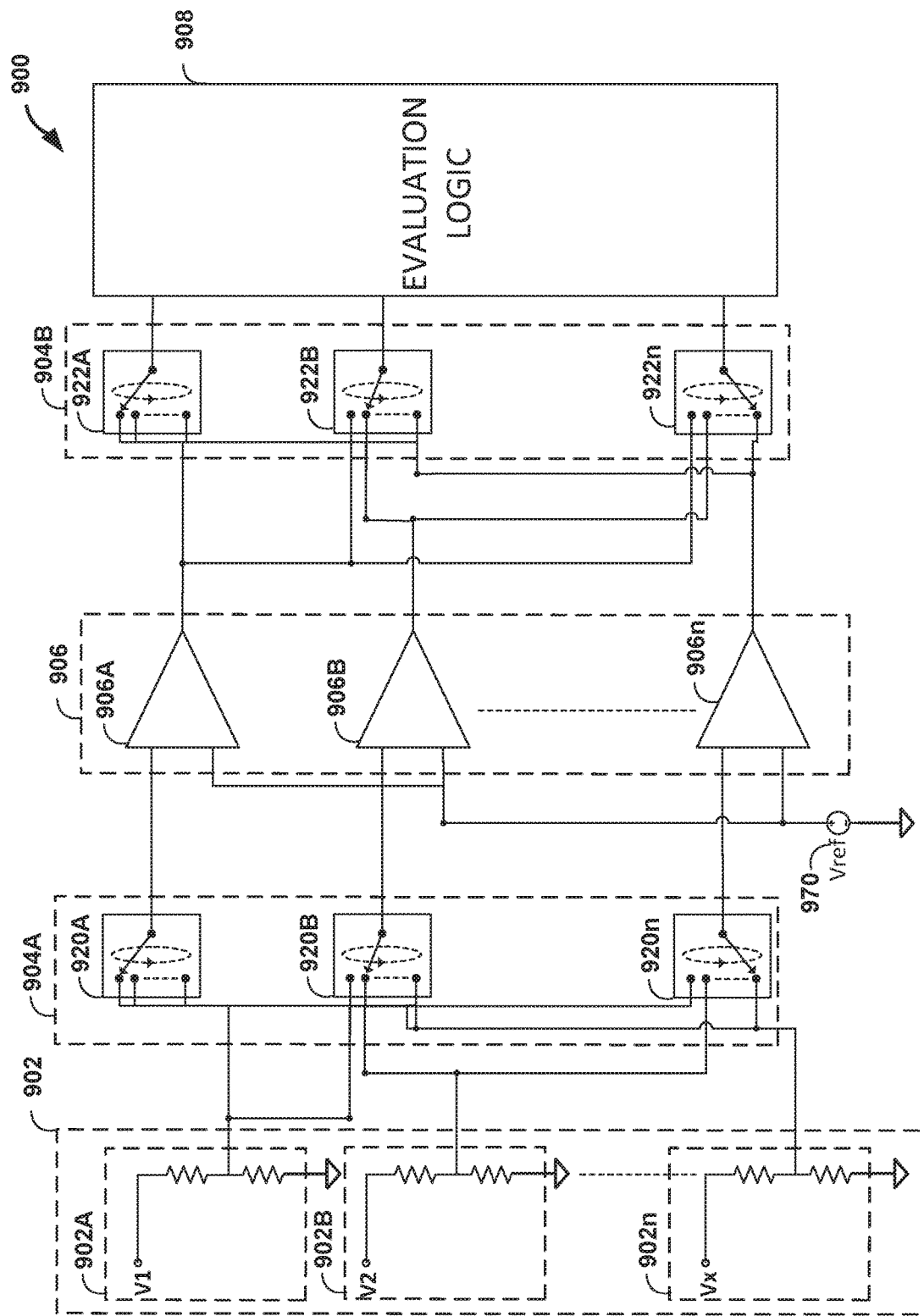
FIG. 9 is a circuit diagram illustrating a first example circuit for detecting failure of a device, in accordance with one or more techniques of this disclosure.

FIG. 9 is a circuit diagram illustrating a first example circuit 900 for detecting failure of a device, in accordance with one or more techniques of this disclosure. Circuit 900 may include voltage dividers 902A, 902B through 902n (collectively, voltage dividers 902), data selector modules 904A, 904B (collectively data selector module 904, comparators 906A, 906B through 906n (collectively, comparators 906), and evaluation logic 908, which may be examples of function modules 102, data selector module 104, monitoring modules 106, and evaluation logic 108, respectively, of FIG. 1. Data selector module 904 includes demultiplexers 920A, 920B through 920n (collectively, demultiplexers 920), and multiplexers 922A, 922B through 922n (collectively, multiplexers 922).

In the example of FIG. 9, two or more of voltage dividers 902 are each configured to output a regulated voltage and each comparator is configured to generate a monitoring value based on a voltage threshold. For instance, comparator 906A may generate a monitoring value with a logical high value in response to the output of demultiplexer 920A exceeding a voltage threshold defined by voltage source 970 (Vref).

In the examples of FIG. 9, voltage source 970 is common to all of voltage dividers 902. As such, comparators 906 may detect a fault at the voltage reference on all of voltage dividers 902. Evaluation logic 908 may remove this common cause by implementing redundant voltage references (not shown). Alternatively, evaluation logic 908 may accept a simultaneous failure on all voltage rails, as long as voltage source 970 and voltage dividers 902 are independent.

In the example of FIG. 9, data selector module 904 may be configured to couple, for each step of a switching cycle, the input of each of comparators 906 to one of voltage dividers 902 such that each of the comparators 906 generates the monitoring value for each of the plurality of function modules to generate monitoring information. The example of FIG. 9 may use a switching scheme illustrated in FIG. 3 or another switching scheme.

Figure 10:
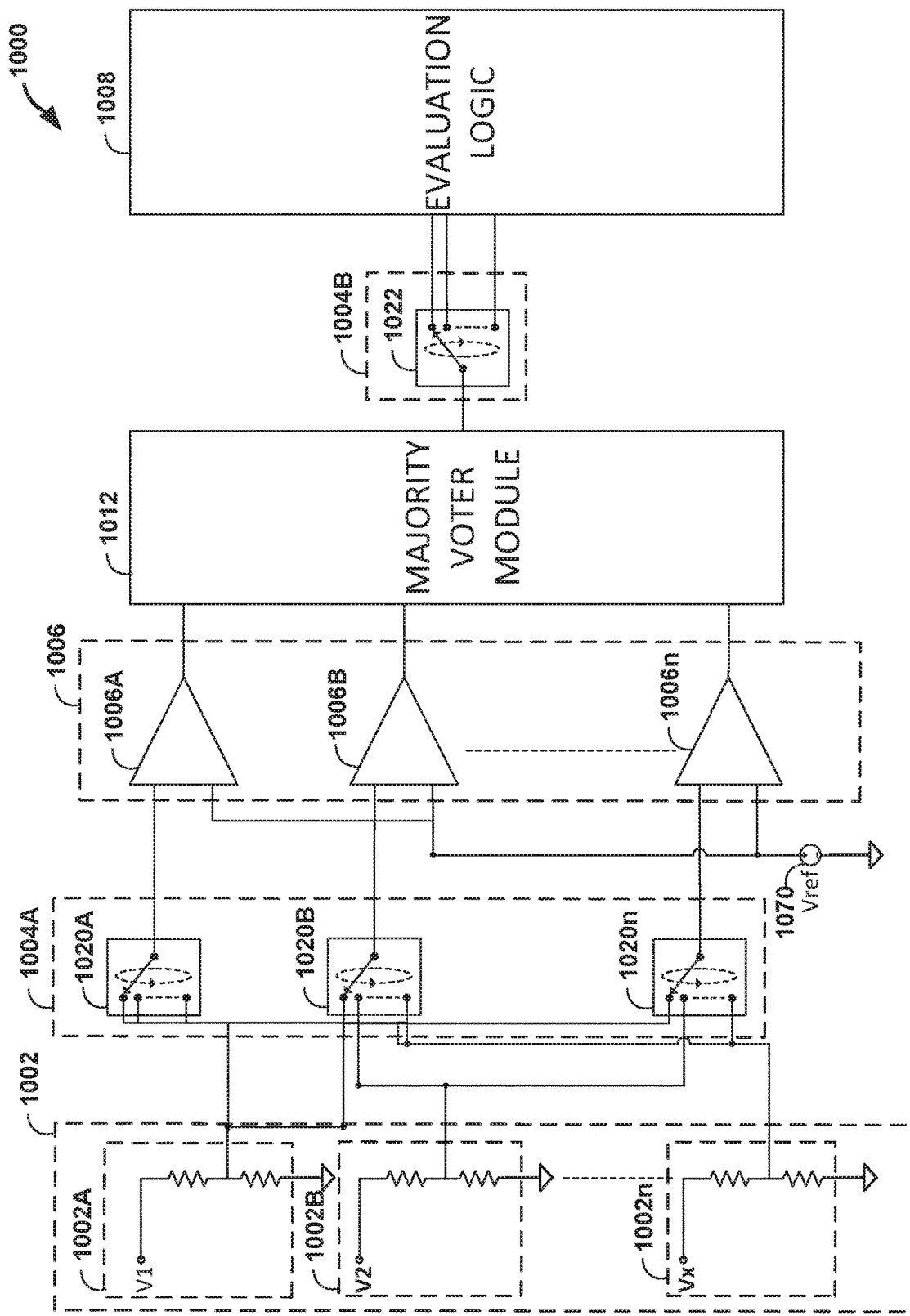
FIG. 10 is a circuit diagram illustrating a second example circuit for detecting failure of a device, in accordance with one or more techniques of this disclosure.

FIG. 10 is a circuit diagram illustrating a second example circuit for detecting failure of a device, in accordance with one or more techniques of this disclosure. Circuit 1000 may include voltage dividers 1002A, 1002B through 1002n (collectively, voltage dividers 1002), data selector modules 1004A, 1004B (collectively data selector module 1004), comparators 1006A, 1006B through 1006n (collectively, comparators 1006), and evaluation logic 1008, which may be examples of function modules 102, data selector module 104, monitoring modules 106, and evaluation logic 108, respectively, of FIG. 1. Data selector module 1004 includes demultiplexers 1020A, 1020B through 1020n (collectively, demultiplexers 1020), and multiplexer 1022. Majority voter module 1012 may be an example of majority voter module 412 of FIG. 4.

In the example of FIG. 10, data selector module 1004 may be configured to couple, for each step of a switching cycle, the input of each of comparators 1006 to one of voltage dividers 1002 such that each of the comparators 1006 generates the monitoring value for each of the plurality of function modules to generate monitoring information. The example of FIG. 10 may use a switching scheme illustrated in FIG. 5 or another switching scheme.

In the examples of FIG. 10, voltage source 1070 is common to all of voltage dividers 1002. As such, comparators 1006 may detect a fault at the voltage reference on all of voltage dividers 1002. Evaluation logic 1008 may remove this common cause by implementing redundant voltage references (not shown). Alternatively, evaluation logic 1008 may accept a simultaneous failure on all voltage rails, as long as voltage source 1070 and voltage dividers 1002 are independent.

Figure 11:
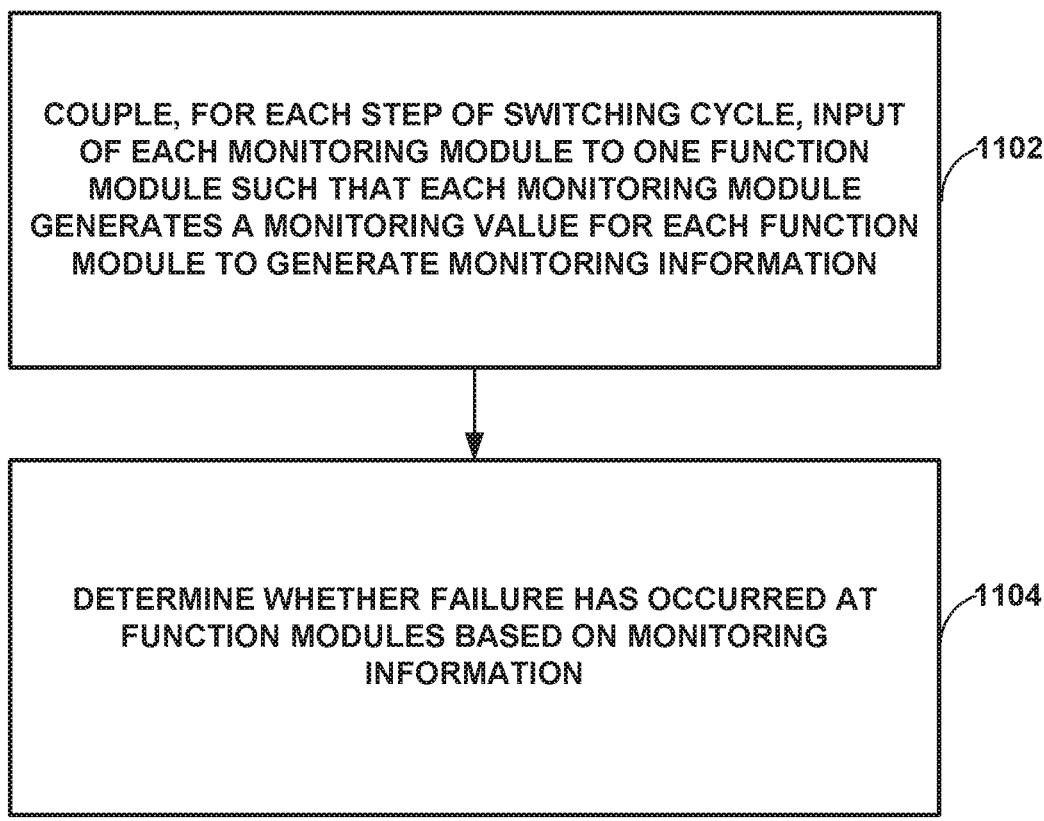
FIG. 11 is a flow diagram illustrating a process for detecting failure of a device, in accordance with this disclosure.

FIG. 11 is a flow diagram illustrating a process for detecting failure of a device, in accordance with this disclosure. FIG. 11 is discussed with reference to FIGS. 1-10 for example purposes only. Data selector module 104 couples, for each step of a switching cycle, an input of each of monitoring modules 106 to one of function modules 102 such that each of monitoring modules 106 generates a monitoring value for each of function modules 102 to generate monitoring information (1102). Evaluation logic 108 determines whether a failure has occurred at function modules 102 based on the monitoring information (1104).

The following examples may illustrate one or more aspects of the disclosure.

Example 1. A circuit for detecting failure of a device, the circuit comprising: a plurality of monitoring modules, wherein each respective monitoring module of the plurality of monitoring modules is configured to generate a monitoring value at an output of the respective monitoring module based on a signal received at an input of the respective monitoring module; a data selector module configured to couple, for each step of a switching cycle, the input of each of the plurality of monitoring modules to one of a plurality of function modules such that each of the plurality of monitoring modules generates the monitoring value for each of the plurality of function modules to generate monitoring information; and evaluation logic configured to determine whether a failure has occurred at the plurality of function modules based on the monitoring information.

Example 2. The circuit of example 1, comprising cycling logic configured to cause, for each step of the switching cycle, the data selector module to: select, for each of the plurality of function modules, one monitoring module from the plurality of monitoring modules; and couple, for each of the plurality of function modules, a respective function module of the plurality of function modules through the selected monitoring module to a respective evaluation input of the evaluation logic that is assigned to the respective function module.

Example 3. The circuit of any combination of examples 1-2, wherein the data selector module comprises, for each respective monitoring module of the plurality of monitoring modules, a multiplexer configured to select one evaluation input from a plurality of evaluation inputs of the evaluation logic and couple the output of the respective monitoring module to the selected evaluation input, each evaluation input of the plurality of evaluation inputs being assigned to a respective function module of the plurality of function modules.

Example 4. The circuit of any combination of examples 1-3, comprising cycling logic configured to cause, for each step of the switching cycle, the data selector module to: select a function module from the plurality of function modules; and couple the selected function module to the input of each of the plurality of monitoring modules.

Example 5. The circuit of any combination of examples 1-4, comprising: a majority voter module configured to receive the monitoring value from the output of each of the plurality of monitoring modules and output a single monitoring value corresponding to a majority of the monitoring values received, wherein the data selector module comprises a multiplexer configured to select one evaluation input from a plurality of evaluation inputs of the evaluation logic and to couple the majority voter module to the selected evaluation input.

Example 6. The circuit of any combination of examples 1-5, wherein the evaluation logic is configured to determine a failure of a particular monitoring module of the plurality of monitoring modules based on the monitoring information.

Example 7. The circuit of any combination of examples 1-6, wherein the data selector module comprises a demultiplexer configured to couple, for each step of the switching cycle, the input of each of the plurality of monitoring modules to one of the plurality of function modules.

Example 8. The circuit of any combination of examples 1-7, wherein two or more of the plurality of function modules are each configured to output a regulated voltage and wherein each monitoring module of the plurality of monitoring modules comprises a comparator configured to generate the monitoring value based on a voltage threshold.

Example 9. The circuit of any combination of examples 1-8, wherein a function module of the plurality of function modules is configured to output a testing voltage that exceeds the voltage threshold.

Example 10. The circuit of any combination of examples 1-9, wherein a time duration for the switching cycle is less than a fault tolerant time for the device.

Example 11. The circuit of any combination of examples 1-10, wherein the plurality of monitoring modules comprises at least three monitoring modules.

Example 12. The circuit of any combination of examples 1-11, wherein the circuit does not include a built-in self-test module.

Example 13. A method for detecting failure of a device, the method comprising: coupling, for each step of a switching cycle, an input of each of a plurality of monitoring modules to one of a plurality of function modules such that each of the plurality of monitoring modules generates a monitoring value for each of the plurality of function modules to generate monitoring information; and determining whether a failure has occurred at the plurality of function modules based on the monitoring information.

Example 14. A method of examples 13, further comprising, for each step of the switching cycle: selecting, for each of the plurality of function modules, one monitoring module of the plurality of monitoring modules; and coupling, for each of the plurality of function modules, a respective function module of the plurality of function modules through the selected monitoring module to a respective evaluation input of the evaluation logic that is assigned to the respective function module.

Example 15. The method of any combination of examples 13-14, wherein coupling comprises, for each respective monitoring module of the plurality of monitoring modules, selecting, by a multiplexer, one evaluation input from a plurality of evaluation inputs of the evaluation logic and coupling, by the multiplexer, the output of the respective monitoring module to the selected evaluation input, each evaluation input of the plurality of evaluation inputs being assigned to a respective function module of the plurality of function modules.

Example 16. The method of any combination of examples 13-15, comprising, for each step of the switching cycle: selecting a function module from the plurality of function modules; and coupling the selected function module to the input of each of the plurality of monitoring modules.

Example 17. The method of any combination of examples 13-16, comprising, for each step of the switching cycle: receiving, by a majority voter module, the monitoring value from the output of each of the plurality of monitoring modules; outputting, by the majority voter module, a single monitoring value corresponding to a majority of the monitoring values received, selecting, by a multiplexer, one evaluation input from a plurality of evaluation inputs of the evaluation logic; and coupling, by the multiplexer, the majority voter module to the selected evaluation input.

Example 18. The method of any combination of examples 13-17, comprising determining a failure of a particular monitoring module of the plurality of monitoring modules based on the monitoring information.

Example 19. The method of any combination of examples 13-18, wherein coupling comprises coupling, by a demultiplexer, for each step of the switching cycle, the input of each of the plurality of monitoring modules to one of the plurality of function modules.

Example 20. A circuit for detecting a failure of a device, the circuit comprising: a plurality of function modules; a plurality of monitoring modules, wherein each respective monitoring module of the plurality of monitoring modules is configured to generate a monitoring value at an output of the respective monitoring module based on a signal received at an input of the respective monitoring module; a data selector module configured to couple, for each step of a switching cycle, the input of each of the plurality of monitoring modules to one of the plurality of function modules such that each of the plurality of monitoring modules generates the monitoring value for each of the plurality of function modules to generate monitoring information; and evaluation logic configured to determine whether a failure has occurred at the plurality of function modules based on the monitoring information.

Various aspects have been described in this disclosure. These and other aspects are within the scope of the following claims.

The invention claimed is:

1. A circuit for detecting failure of a device, the circuit comprising:
a plurality of monitoring modules, wherein each respective monitoring module of the plurality of monitoring modules is configured to generate a monitoring value at an output of the respective monitoring module based on a signal received at an input of the respective monitoring module;
a data selector module configured to couple, for each step of a switching cycle, the input of each of the plurality of monitoring modules to one of a plurality of function modules such that each of the plurality of monitoring modules generates the monitoring value for each of the plurality of function modules to generate monitoring information; and
evaluation logic configured to determine whether a failure has occurred at the plurality of function modules based on the monitoring information.

2. The circuit of claim 1, comprising cycling logic configured to cause, for each step of the switching cycle, the data selector module to:
select, for each of the plurality of function modules, one monitoring module from the plurality of monitoring modules; and
couple, for each of the plurality of function modules, a respective function module of the plurality of function modules through the selected monitoring module to a respective evaluation input of the evaluation logic that is assigned to the respective function module.

3. The circuit of claim 1, wherein the data selector module comprises, for each respective monitoring module of the plurality of monitoring modules, a multiplexer configured to select one evaluation input from a plurality of evaluation inputs of the evaluation logic and couple the output of the respective monitoring module to the selected evaluation input, each evaluation input of the plurality of evaluation inputs being assigned to a respective function module of the plurality of function modules.

4. The circuit of claim 1, comprising cycling logic configured to cause, for each step of the switching cycle, the data selector module to:
   select a function module from the plurality of function modules; and
   couple the selected function module to the input of each of the plurality of monitoring modules.

5. The circuit of claim 1, comprising:
   a majority voter module configured to receive the monitoring value from the output of each of the plurality of monitoring modules and output a single monitoring value corresponding to a majority of the monitoring values received,
   wherein the data selector module comprises a multiplexer configured to select one evaluation input from a plurality of evaluation inputs of the evaluation logic and to couple the majority voter module to the selected evaluation input.

6. The circuit of claim 1, wherein the evaluation logic is configured to determine a failure of a particular monitoring module of the plurality of monitoring modules based on the monitoring information.

7. The circuit of claim 1, wherein the data selector module comprises a demultiplexer configured to couple, for each step of the switching cycle, the input of each of the plurality of monitoring modules to one of the plurality of function modules.

8. The circuit of claim 1, wherein two or more of the plurality of function modules are each configured to output a regulated voltage and wherein each monitoring module of the plurality of monitoring modules comprises a comparator configured to generate the monitoring value based on a voltage threshold.

9. The circuit of claim 8, wherein a function module of the plurality of function modules is configured to output a testing voltage that exceeds the voltage threshold.

10. The circuit of claim 1, wherein a time duration for the switching cycle is less than a fault tolerant time for the device.

11. The circuit of claim 1, wherein the plurality of monitoring modules comprises at least three monitoring modules.

12. The circuit of claim 1, wherein the circuit does not include a built-in self-test module.

13. A method for detecting failure of a device, the method comprising:
   coupling, for each step of a switching cycle, an input of each of a plurality of monitoring modules to one of a plurality of function modules such that each of the plurality of monitoring modules generates a monitoring value for each of the plurality of function modules to generate monitoring information; and
   determining whether a failure has occurred at the plurality of function modules based on the monitoring information.

14. The method of claim 13, further comprising, for each step of the switching cycle:
   selecting, for each of the plurality of function modules, one monitoring module of the plurality of monitoring modules; and
   coupling, for each of the plurality of function modules, a respective function module of the plurality of function modules through the selected monitoring module to a respective evaluation input of the evaluation logic that is assigned to the respective function module.

15. The method of claim 13, wherein coupling comprises, for each respective monitoring module of the plurality of monitoring modules, selecting, by a multiplexer, one evaluation input from a plurality of evaluation inputs of the evaluation logic and coupling, by the multiplexer, the output of the respective monitoring module to the selected evaluation input, each evaluation input of the plurality of evaluation inputs being assigned to a respective function module of the plurality of function modules.

16. The method of claim 13, comprising, for each step of the switching cycle:
   selecting a function module from the plurality of function modules; and
   coupling the selected function module to the input of each of the plurality of monitoring modules.

17. The method of claim 13, comprising, for each step of the switching cycle:
   receiving, by a majority voter module, the monitoring value from the output of each of the plurality of monitoring modules;
   outputting, by the majority voter module, a single monitoring value corresponding to a majority of the monitoring values received,
   selecting, by a multiplexer, one evaluation input from a plurality of evaluation inputs of the evaluation logic; and
   coupling, by the multiplexer, the majority voter module to the selected evaluation input.

18. The method of claim 13, comprising:
   determining a failure of a particular monitoring module of the plurality of monitoring modules based on the monitoring information.

19. The method of claim 13, wherein coupling comprises coupling, by a demultiplexer, for each step of the switching cycle, the input of each of the plurality of monitoring modules to one of the plurality of function modules.

20. A circuit for detecting a failure of a device, the circuit comprising:
   a plurality of function modules;
   a plurality of monitoring modules, wherein each respective monitoring module of the plurality of monitoring modules is configured to generate a monitoring value at an output of the respective monitoring module based on a signal received at an input of the respective monitoring module;
   a data selector module configured to couple, for each step of a switching cycle, the input of each of the plurality of monitoring modules to one of the plurality of function modules such that each of the plurality of monitoring modules generates the monitoring value for each of the plurality of function modules to generate monitoring information; and
   evaluation logic configured to determine whether a failure has occurred at the plurality of function modules based on the monitoring information.

* * * * *